(12) United States Patent
Satoh et al.

(10) Patent No.: US 9,082,695 B2
(45) Date of Patent: Jul. 14, 2015

(54) VIALESS MEMORY STRUCTURE AND METHOD OF MANUFACTURING SAME

(75) Inventors: Kimihiro Satoh, Beaverton, OR (US); Yiming Huai, Pleasanton, CA (US); Jing Zhang, Los Altos, CA (US)

(73) Assignee: Avalanche Technology, Inc., Fremont, CA (US)

( * ) Notice: Subject to any disclaimer, the term of this patent is extended or adjusted under 35 U.S.C. 154(b) by 105 days.

(21) Appl. No.: 13/154,346

(22) Filed: Jun. 6, 2011

(65) Prior Publication Data

US 2012/0306033 A1     Dec. 6, 2012

(51) Int. Cl.
| | |
|---|---|
| *H01L 29/82* | (2006.01) |
| *H01L 21/8246* | (2006.01) |
| *H01L 43/12* | (2006.01) |
| *H01L 27/115* | (2006.01) |
| *H01L 27/22* | (2006.01) |
| *H01L 43/08* | (2006.01) |

(52) U.S. Cl.
CPC ............ *H01L 27/222* (2013.01); *H01L 27/224* (2013.01); *H01L 27/228* (2013.01); *H01L 43/08* (2013.01); *H01L 43/12* (2013.01)

(58) Field of Classification Search
CPC ....... H01L 43/08; H01L 43/12; H01L 27/222; H01L 27/224; H01L 27/228
USPC .............. 438/3, 171, 210; 257/306, E27.087, 257/E21.648, E21.665
See application file for complete search history.

(56) References Cited

U.S. PATENT DOCUMENTS

| | | | |
|---|---|---|---|
| 4,193,082 A | 3/1980 | Dougherty | |
| 4,202,007 A | 5/1980 | Dougherty et al. | |
| 4,754,431 A | 6/1988 | Jensen | |
| 4,897,288 A | 1/1990 | Jensen | |
| 4,918,655 A | 4/1990 | Daughton | |
| 5,936,811 A | 8/1999 | Seagle | |
| 6,158,108 A | 12/2000 | Seagle | |
| 6,479,765 B2 | 11/2002 | Ramey et al. | |
| 6,734,079 B2 * | 5/2004 | Huang et al. .................. | 438/396 |
| 6,806,096 B1 * | 10/2004 | Kim et al. .......................... | 438/3 |
| 6,855,115 B2 | 2/2005 | Fonseca et al. | |
| 7,147,604 B1 | 12/2006 | Allen et al. | |
| 7,481,771 B2 | 1/2009 | Fonseca et al. | |
| 7,574,792 B2 | 8/2009 | O'Brien et al. | |
| 7,699,059 B2 | 4/2010 | Fonseca et al. | |
| 7,843,008 B2 | 11/2010 | Okushima | |
| 7,897,950 B2 | 3/2011 | Shoji | |
| 7,919,794 B2 | 4/2011 | Gu et al. | |
| 7,919,826 B2 | 4/2011 | Iwayama et al. | |
| 7,936,027 B2 | 5/2011 | Xiao et al. | |
| 7,955,870 B2 | 6/2011 | Ditizio | |
| 7,985,667 B2 | 7/2011 | Cho | |
| 7,989,224 B2 | 8/2011 | Gaidis | |
| 2002/0146851 A1 * | 10/2002 | Okazawa et al. ................. | 438/3 |
| 2004/0014243 A1 * | 1/2004 | Drewes ............................. | 438/3 |
| 2004/0087039 A1 * | 5/2004 | Gupta et al. ...................... | 438/3 |

(Continued)

*Primary Examiner* — Marvin Payen
*Assistant Examiner* — Jeremy Joy
(74) *Attorney, Agent, or Firm* — Maryam Imam; Bing K. Yen

(57) ABSTRACT

A method of manufacturing a magnetic memory cell, including a magnetic tunnel junction (MTJ), includes using silicon nitride layer and silicon oxide layer to form a trench for depositing copper to be employed for connecting the MTJ to other circuitry without the use of a via.

8 Claims, 17 Drawing Sheets

(56) References Cited

U.S. PATENT DOCUMENTS

| | | | |
|---|---|---|---|
| 2005/0214953 A1* | 9/2005 | Lee et al. | 438/3 |
| 2009/0209050 A1* | 8/2009 | Wang et al. | 438/3 |
| 2009/0261433 A1* | 10/2009 | Kang et al. | 257/421 |
| 2009/0302405 A1* | 12/2009 | Gaidis et al. | 257/421 |
| 2010/0102406 A1* | 4/2010 | Xi et al. | 257/421 |
| 2010/0102407 A1* | 4/2010 | Kajiyama et al. | 257/421 |
| 2010/0193888 A1* | 8/2010 | Gu et al. | 257/421 |
| 2011/0127626 A1* | 6/2011 | Li et al. | 257/421 |

* cited by examiner

VIALESS MEMORY STRUCTURE AND METHOD OF MANUFACTURING SAME

BACKGROUND OF THE INVENTION

1. Field of the Invention

The present invention relates generally to semiconductor memory and method of manufacturing the same and particularly to via-less memory structures and method of manufacturing same.

2. Description of the Prior Art

Magnetic random access memory (MRAM) is rapidly gaining popularity as its use in replacing conventional memory is showing promise. MRAM memory element consists of a top electrode connecting to a bit line, a magnetic tunnel junction (MTJ), and a bottom electrode connecting to a control device such as a FET transistor or a diode. The MTJ further includes a free layer, a pinned layer and a barrier layer. Manufacturing of the MRAM has offered challenges.

The size of the memory element has been reduced to minimize the memory cell area. It has become smaller than the size of the via, the latter being used to form a connection to the MTJ and to an upper metal line serving as a bit line. A side wall of the top electrode is exposed during the via hole etching. When the bottom of the via hole reaches the barrier layer, the pinned layer and the free layer are shorted together in the process of filling the via with metal. Conversely, the shallow via hole often makes no contact with the top electrode because during the via etching process, the bottom of the via does not reach the top electrode of the MTJ resulting in an undesirably open connection between the MTJ and the upper metal line. The process margin for etching is therefore limited. Also, open and short scenarios are highly dependent on the thickness of the top electrode.

Efforts have been used to overcome this problem by using a thick top electrode formed on top of the MTJ but this presents a challenge for fine patterning including photo and etch processes. Thick photo resist and/or thick hard mask is required to make a pattern in the top electrode, which does not meet the requirements for fine patterning since fine patterning requires thin photoresist and hard mask.

Further, there are multiple steps employed in building an MTJ with a separate step needed for making the via, which adds to manufacturing time and expense.

Thus, the need arises for manufacturing of magnetic memory more reliably and expeditiously.

SUMMARY OF THE INVENTION

Briefly, a magnetic memory cell is disclosed to include a bottom electrode, a MTJ memory element formed on top of the bottom electrode and including a pinned layer, a free layer and barrier layer formed in between the pinned layer and the free layer, and a top electrode formed on top of the MTJ memory element. Further, a dielectric layer serving as a first protection layer is formed on a side wall of the MTJ memory element covering the barrier layer, and a different dielectric layer from the first protection layer serving as a second protection layer is formed to cover the MTJ sidewall and the first protection layer, and a bit line directly connects to the top electrode without a via.

In alternative embodiments, rather than a MTJ, other types of suitable memory elements may be employed, such as but not limited to, phase shift memory, resistive random access memory (RRAM) or any other memory having a switching memory element.

These and other objects and advantages of the present invention will no doubt become apparent to those skilled in the art after having read the following detailed description of the various embodiments illustrated in the several figures of the drawing.

IN THE DRAWINGS

FIGS. 1-6 and 12-17 show a method of making a magnetic memory cell in accordance with another method of the present invention.

DETAILED DESCRIPTION OF THE PREFERRED EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In an embodiment and method of the present invention, methods of fabricating magnetic memory cell are disclosed. A magneto (or "magnetic") tunnel junction (MTJ) is included in the magnetic memory cell and a metal line is directly connected to the MTJ without the need for a via. As will be disclosed, various methods of manufacturing a magnetic memory cell, which includes a magnetic tunnel junction (MTJ), are disclosed to protect the MTJ sidewall with a dielectric layer to prevent shorting and to directly connect the MTJ to the upper metal line (or "bit line") without the use of a via.

It is understood that instead of a MTJ, other types of suitable memory cells may be employed using the methods and embodiments disclosed herein, such as but not limited to phase shift memory, resistive memory or any other memory having a switching memory element.

FIGS. 1-11 show a method of making a magnetic memory cell in accordance with a method and embodiment of the present invention.

FIGS. 1-6 and 12-17 a method of making a magnetic memory cell in accordance with another method and embodiment of the present invention.

Figure 1:
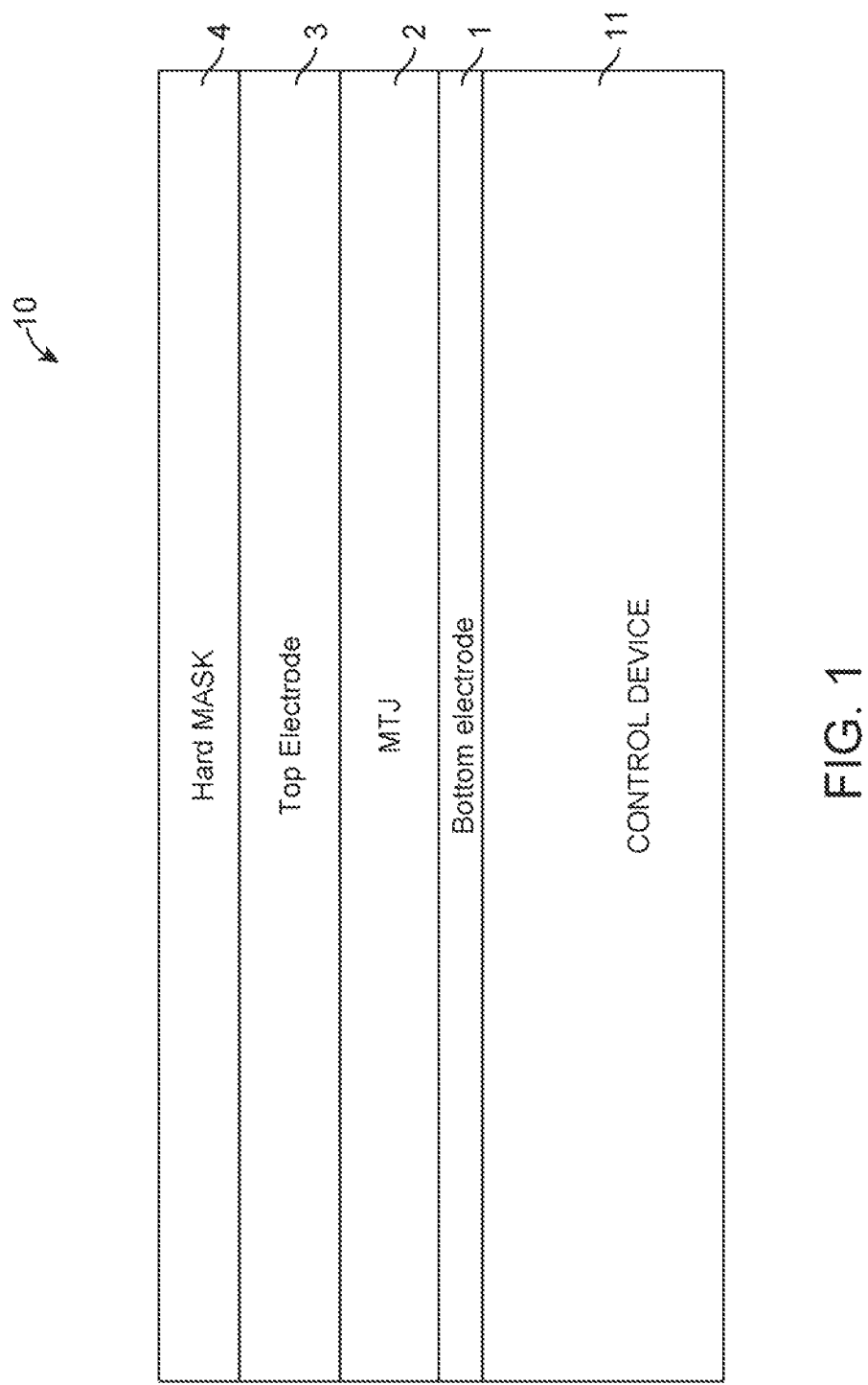
FIGS. 1-11 show a method of making a magnetic memory cell in accordance with an embodiment of the present invention.

Referring now to FIG. 1, the relevant layers of a magnetic memory cell 10 that is being built are shown. The cell 10 is shown to include a control device 11, and a bottom electrode 1 that is formed on top of the control device 11, a MTJ 2 that is formed on top of the bottom electrode 1, a top electrode 3 that is formed on top of the MTJ 2 and a hard mask 4 that is shown formed on top of the top electrode 3. The terms "bottom element" are herein abbreviated to "BE" and the terms "top electrode" are herein abbreviated to "TE".

The control device 11 typically includes transistors and other semiconductor devices needed to operate the MTJ 2 but made using a process different that which is used to make the layers shown in FIG. 1 except the control device 11.

The MTJ 2, as readily known, is made of multiple layers, not shown in FIG. 1, such as typically and at least a fixed layer, a barrier layer and a free layer, with the barrier layer formed between the fixed layer and free layer.

The hard mask 4 is generally used for patterning and can be made of silicon dioxide (SiO2), silicon nitride (SiN), aluminum oxide or titanium nitride (TiN).

Figure 2:
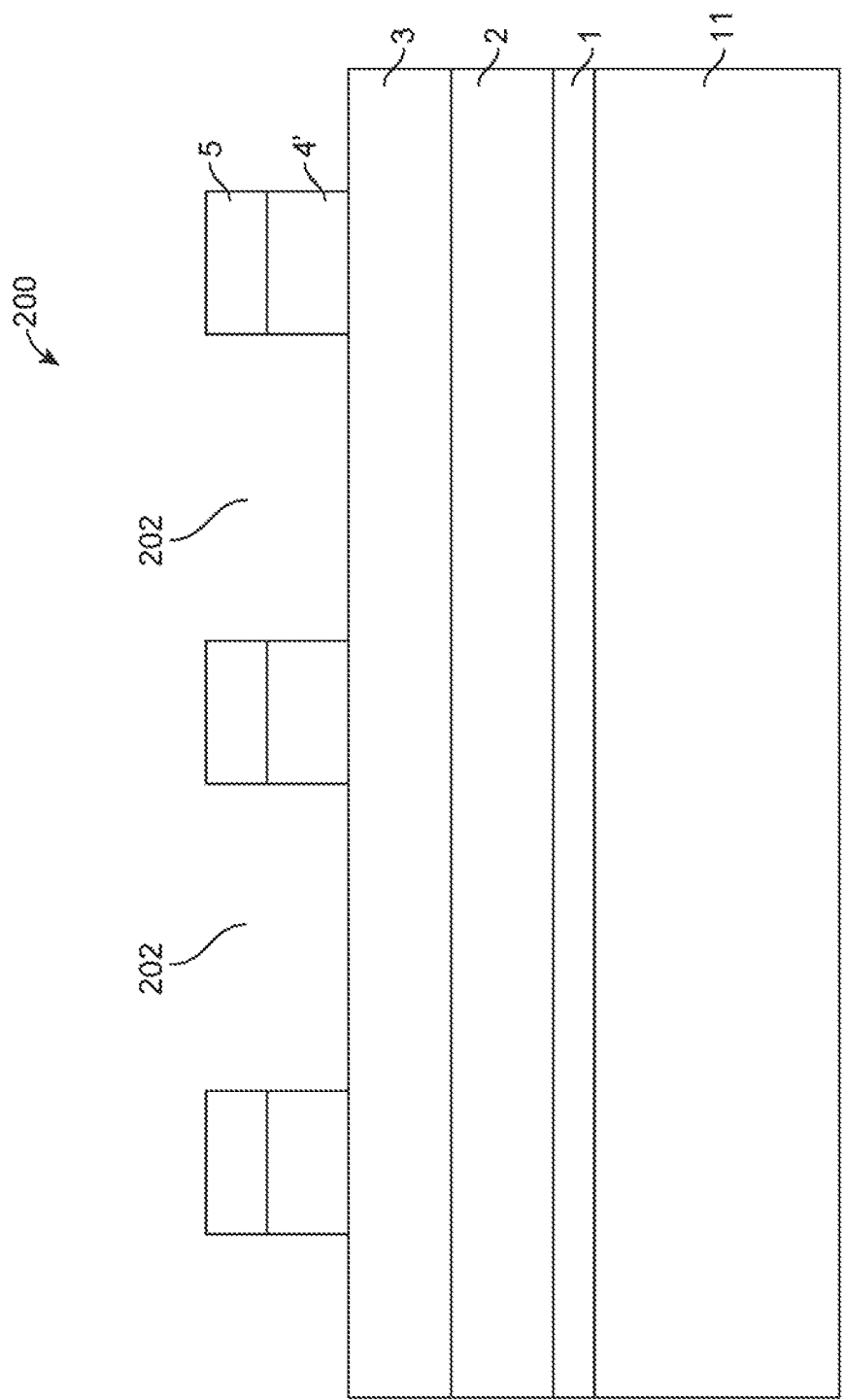

As shown in FIG. 2, the step 200 is performed where the photoresist is patterned into photoresist pattern 5' on top of the hard mask 4 using conventional photolithography. The hard mask 4 is vertically dry etched after it is masked with the photoresist pattern 5' to transfer the photoresist pattern 5' into the hard mask 4'.

Figure 3:
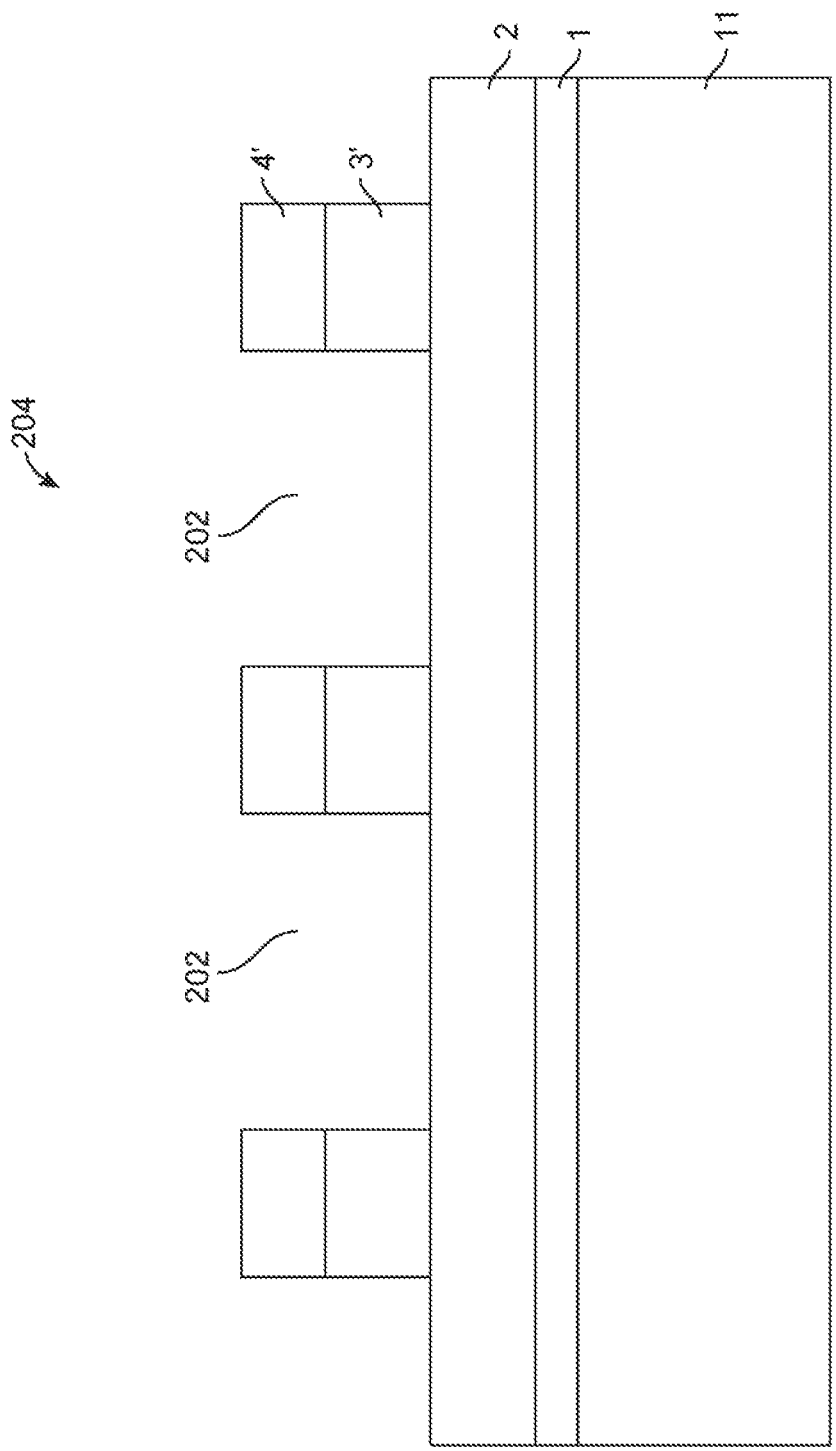

Next, the step 204 is performed, as shown in FIG. 3, where another vertical dry etching process is performed to etch the top electrode 3 leaving top electrode 3' and removing the top electrode 3 in the non-masked areas 202 shown in FIG. 2. This process is also referred to herein as "top electrode etching".

Figure 4:
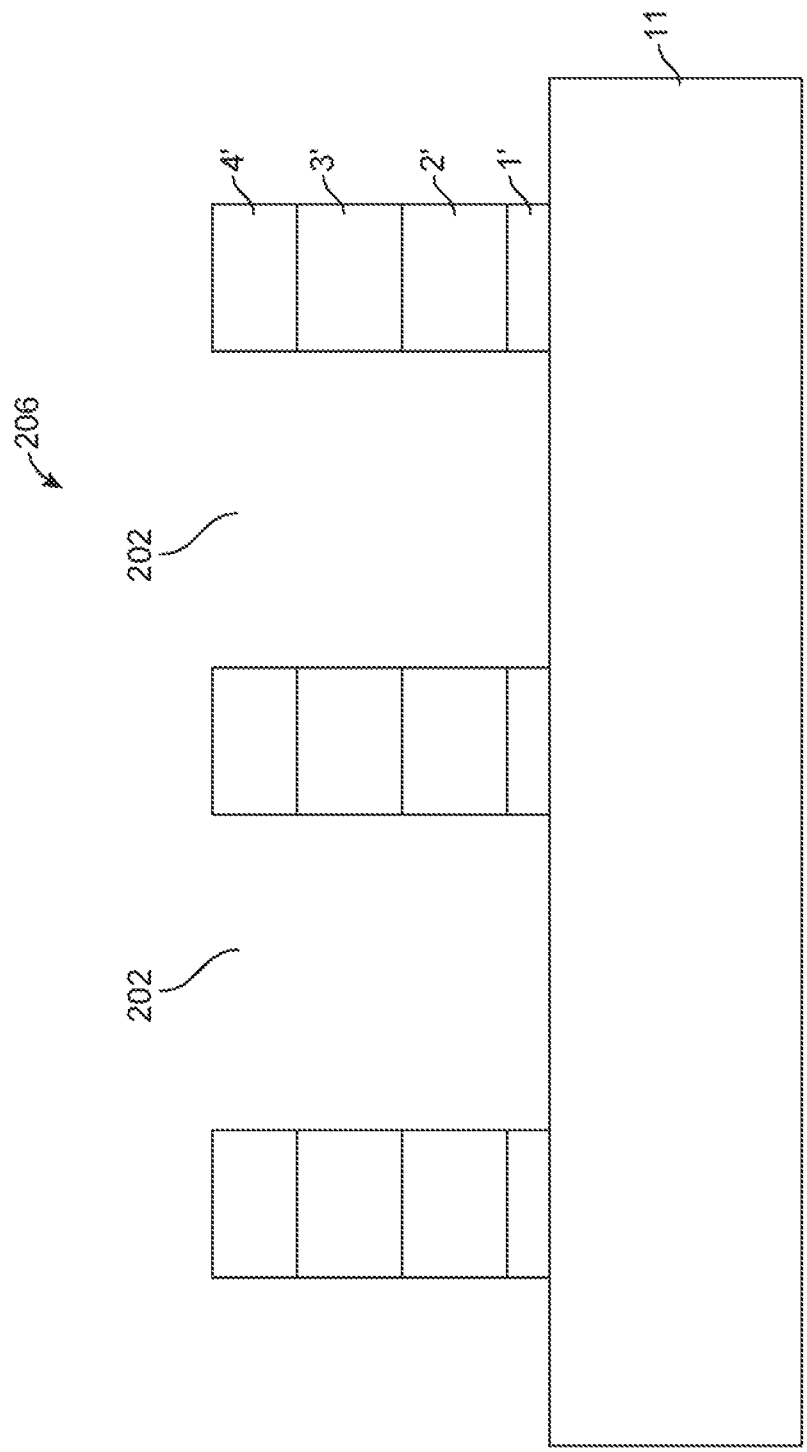

Next, at step 206, shown in FIG. 4, the MTJ 2 and the BE 1, in FIG. 3, are etched to the MTJ 2' and BE 1', shown in FIG. 4, after they are masked with the hard mask 4', respectively. It is noted that during the steps 200, 204 and 206, the hard mask 4' works as an etching mask to protect the layers thereunder from being etched, which is the reason the BE 1', MTJ 2' and TE 3' remain. "MTJ stack pillar" is comprised of the hard mask 4', the TE 3', the MTJ 2' and the BE 1'.

Figure 5:
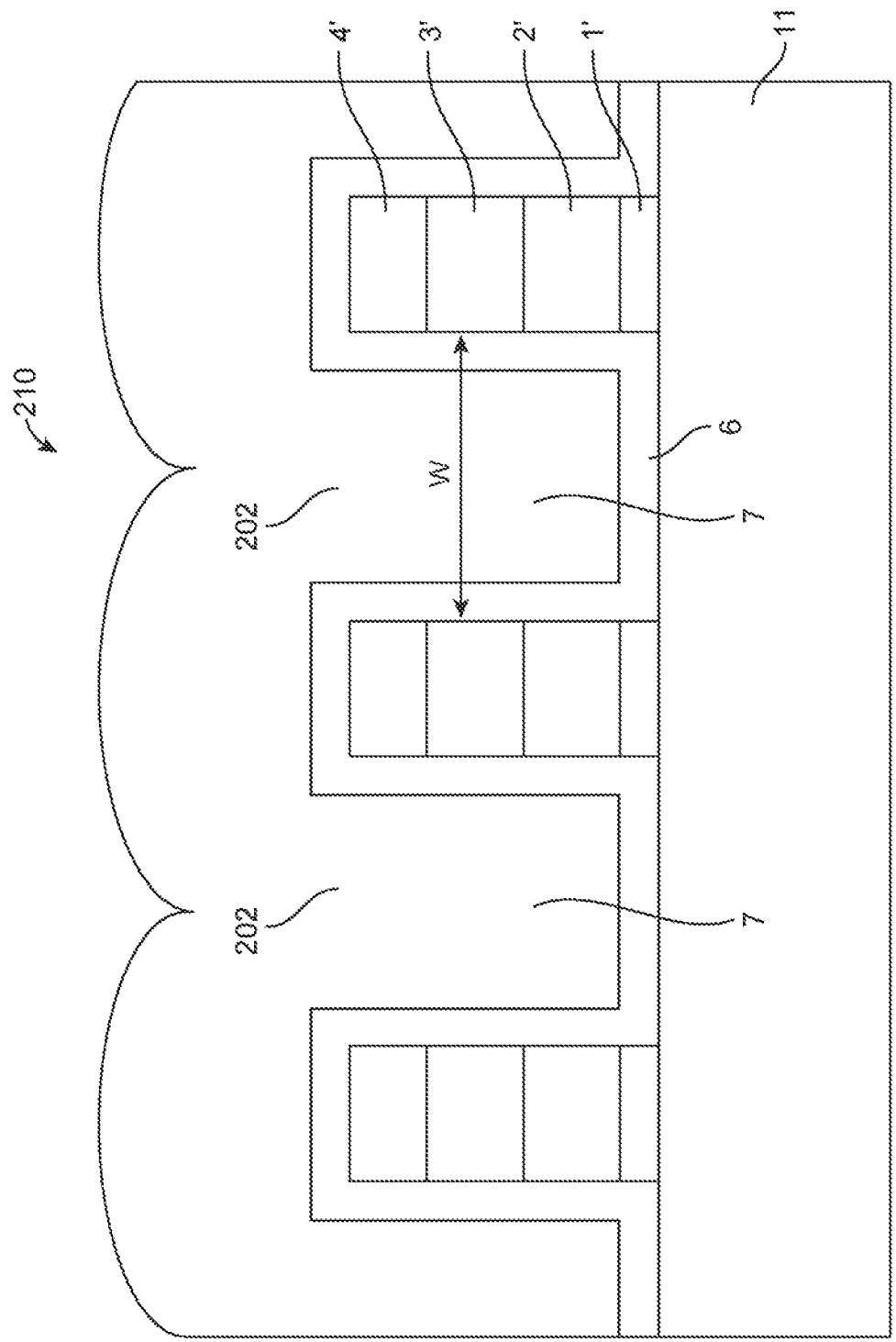

Next, at step 210, shown in FIG. 5, a dielectric layer 6 is deposited on top of and around the MTJ stack pillar, and the spaces between the MTJ stack pillars, as shown in FIG. 5. That is, the layer 6 is deposited over the structure shown in FIG. 4.

In some embodiments, the layer 6 is made of silicon nitride. In some embodiments, the thickness of the layer 6 is less than W/4 where 'W' is the space between two MTJ stack pillars. Further, a dielectric layer 7 is made of a material that is different from the layer 6 and is deposited on top of the layer 6. In some embodiments, the layer 7 is made of silicon oxide and the thickness of the layer 7 is greater than W/2 to fill in between the pillars. The layer 7 is formed on top of the MTJ stack pillars and in between thereof.

Figure 6:
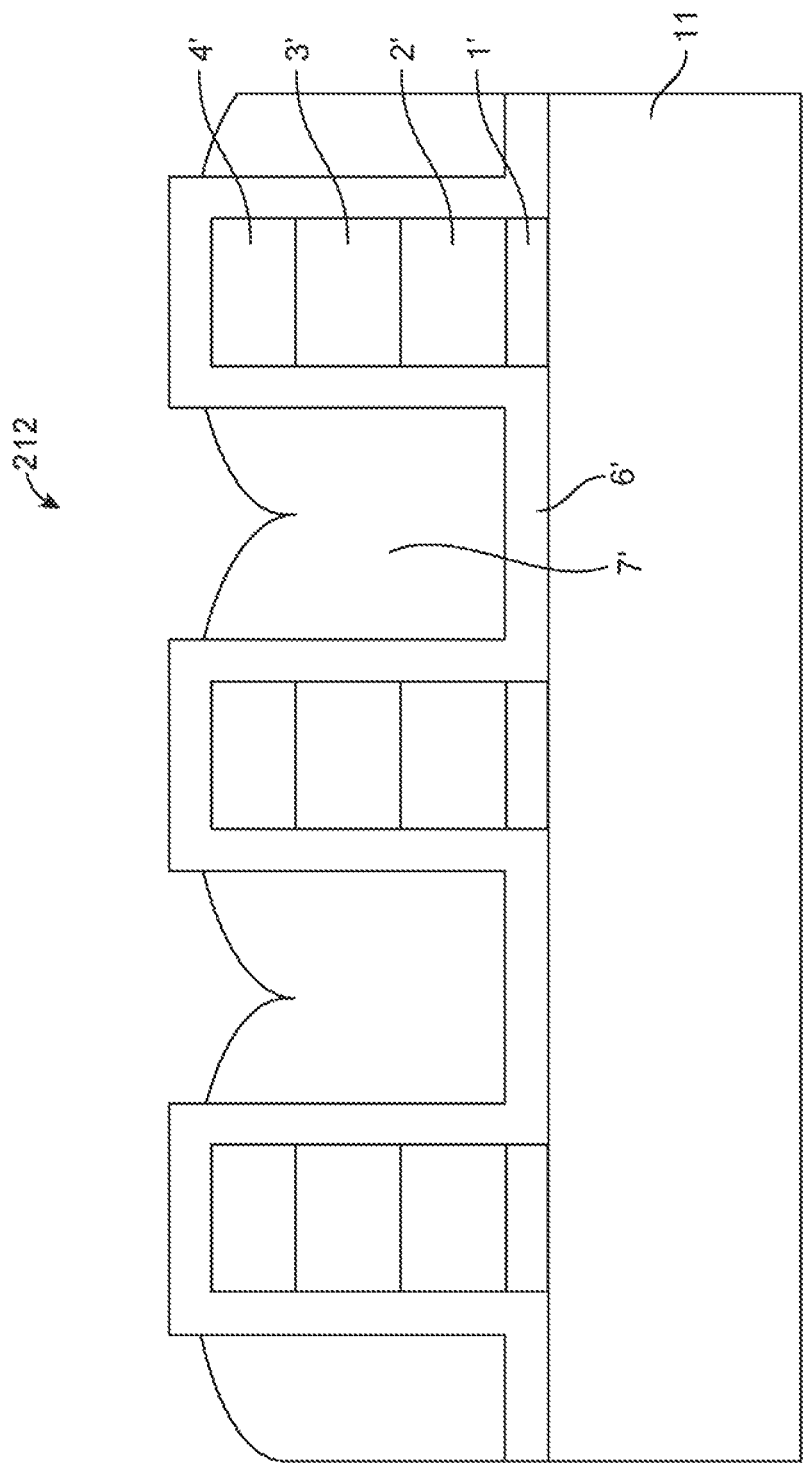

Next, at step 212, shown in FIG. 6, the layer 7 is vertically etched down to the top of the MTJ stack pillars to leave the recessed layer 7' (also referred to herein as "protection layer") using vertical dry etching. The thickness of the layer 7 in the areas 202 between the pillars is much thicker than that over the pillars. The etching chemistry is selected to have an etch rate of the layer 7 to be faster than that of the layer 6. That is, the layer 7 is etched to approximately the top or thereabout of the MTJ stack pillars, as shown in FIG. 6. During the foregoing etching step, because the layer 7 has a faster etching rate than the layer 6, the layer 6 is not etched and in fact, in some methods of the present invention, the top of the layer 6 is used as a etch stop layer.

In some methods of the present invention, the process continues from here to FIG. 12, as will be discussed later and continues from thereon. In other embodiments, the process continues to FIG. 7 as discussed below.

Figure 7:
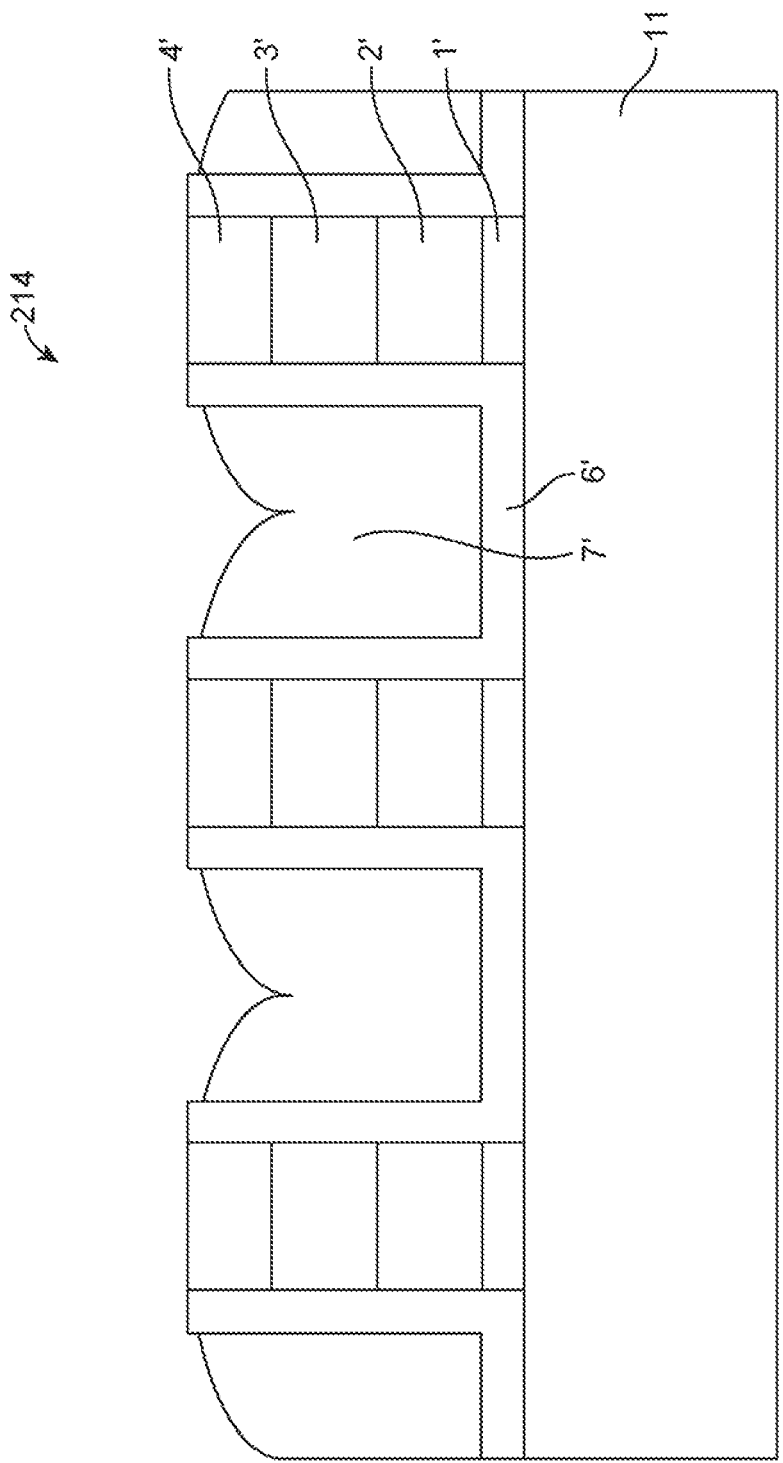

Next, at step 214, as shown in FIG. 7, the layer 6 is etched to form recessed layer 6' (also referred to herein as "protection layer"), which removes the layer 6 in areas that are on top of the MTJ pillar stacks. The etching chemistry that is selected results in the etching rate of the layer 6 being greater than that of the layer 7' to prevent etching of the layer 7'. Thus, etching stop is achieved by changing the etching chemistry to reverse the etch selectivity of the oxide in the layer 7' and the nitride in the layer 6'. The sidewall of MTJ 2' is covered with layer 6' and layer 6' is protected by layer 7'. The layers 6' and 7' protect the side wall of MTJ 2' during subsequent etch steps.

Figure 8:
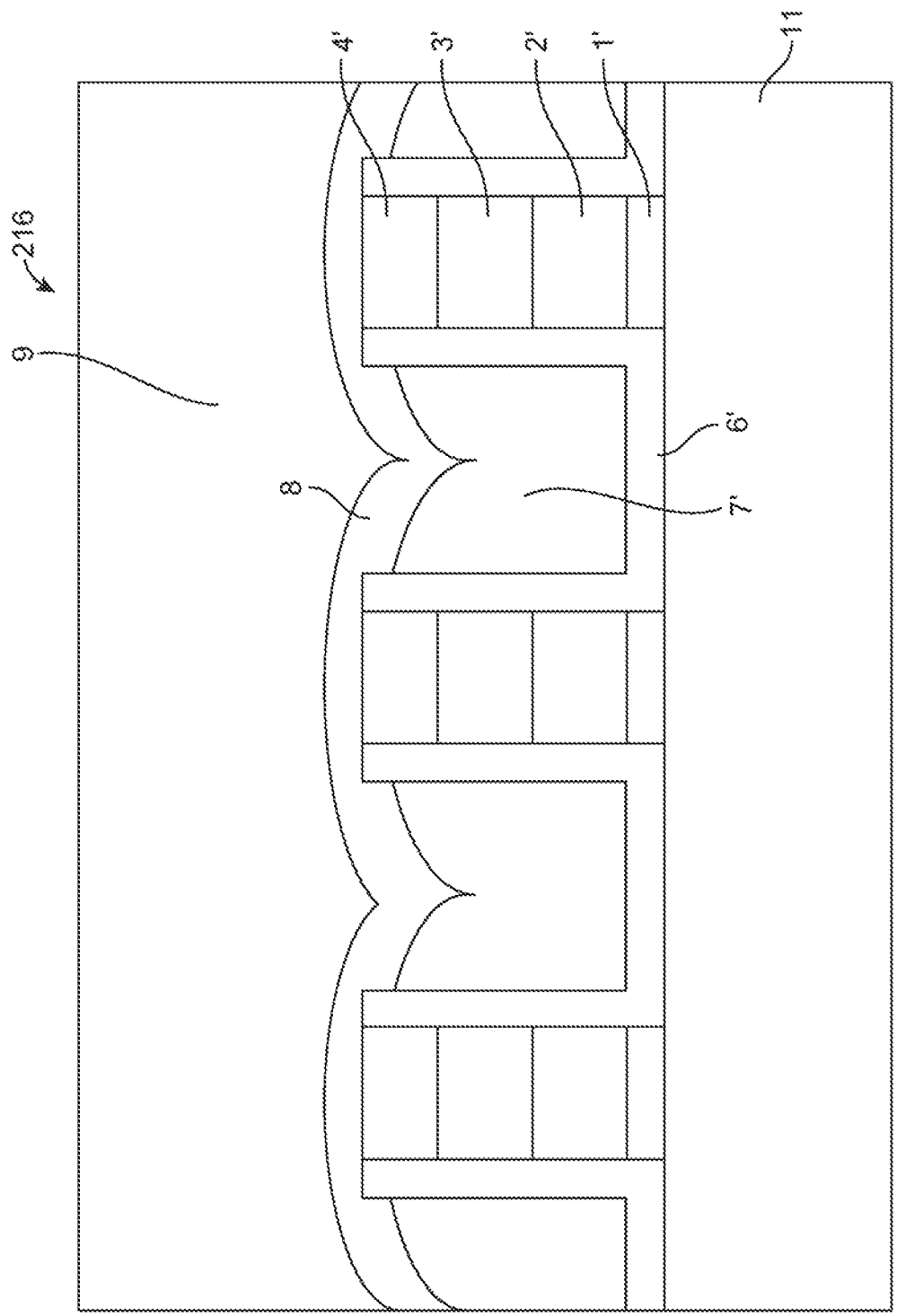

Next, at step 216, shown in FIG. 8, a dielectric layer 8, made from a different material than that of layer 7', is deposited on top of the layer 7' and acts as an etch stop layer in the following process. In some embodiments, the layer 8 is made of silicon nitride. Also, a dielectric layer 9, which is made of a different material than the layer 8, is deposited on top of the layer 8. In some embodiments, the layer 9 is made of made of silicon oxide. It is noted that the layers 8 and 9 are made of different material to ensure that their etching rates are different for reasons that will be evidently shortly. Next, the layer 9 is planarized using chemical mechanical polishing (CMP).

Figure 9:
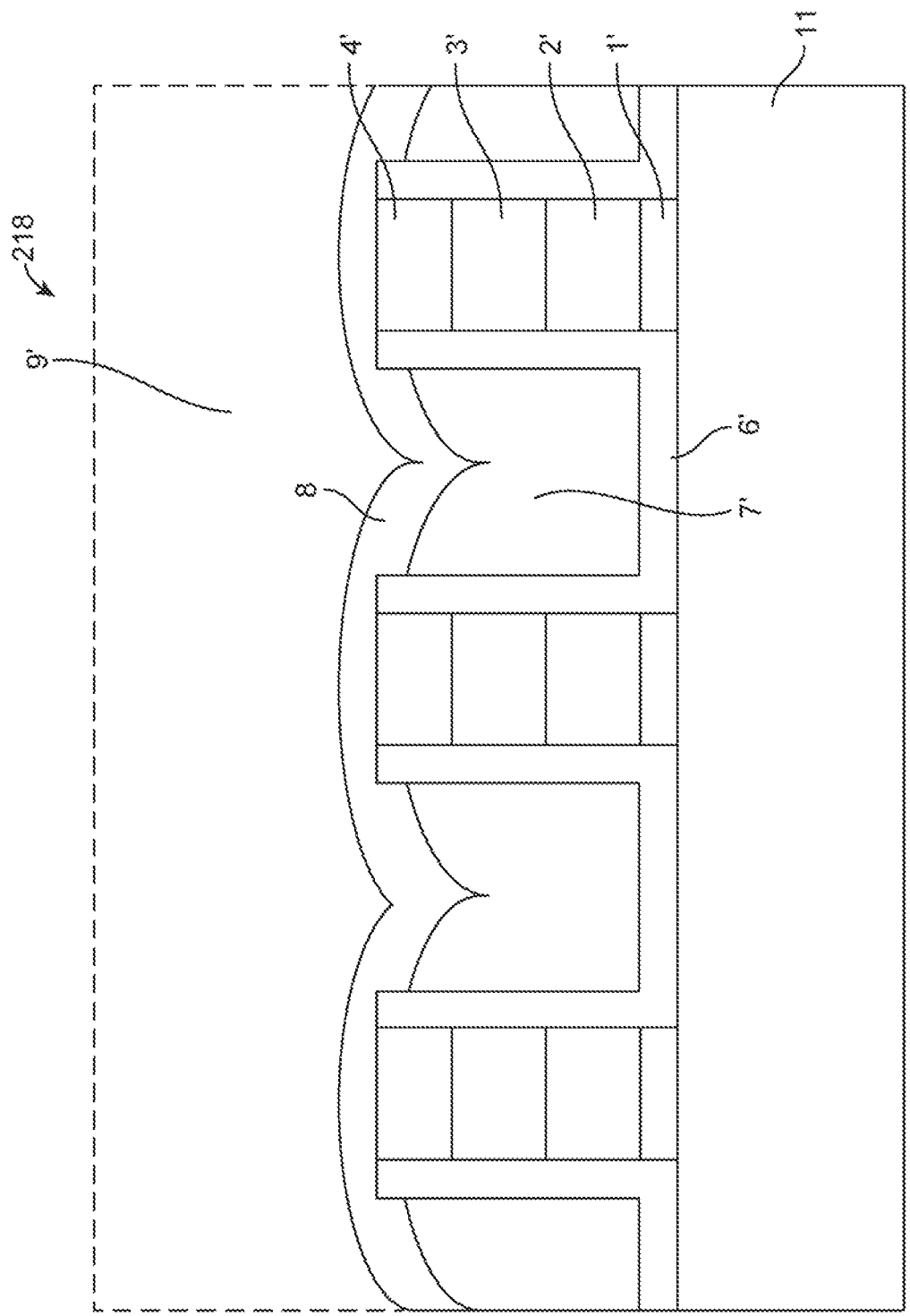

Next, at step 218, in FIG. 9, a trench 9' is formed by using a conventional lithography and vertical dry etching to etch the layer 9 to substantially remove it and form the trench 9'. Etching during this etching step is stopped when the layer 8 is reached and this is the reason the layer 8 serves as an etch stop layer. As earlier noted, the layers 9 and 8 are made of different material and in this respect etching selectivity is adjusted by its ambient such as etching gas system. In some embodiments, an etching ambient is adjusted as the etching selectivity of the layer 9 to the layer 8 is greater than one. The sidewall MTJ 2' is protected with layer 6' and 7' so that it is not exposed during the etchings.

Figure 10:
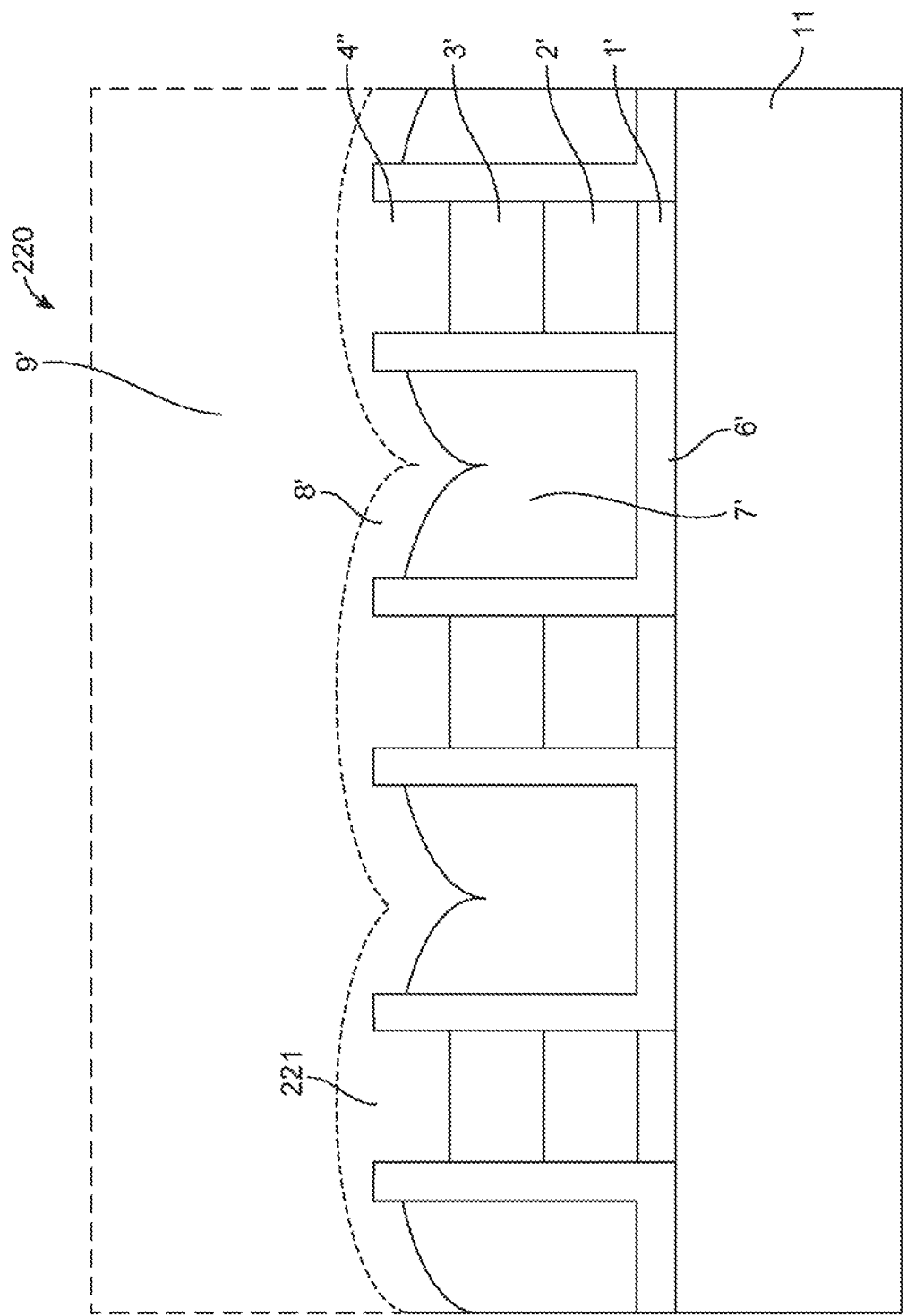

Next, at step 220, in FIG. 10, etching is performed by changing the etching chemistry to reverse the etching rate of the layer 7' to be slower than the layer 8 thereby etching to substantially remove the layer 8, under the trench 9' to form the extended trench 8', and to further remove the hard mask 4' if necessary. A metal line to be formed in the trench 9' is therefore directly connected to TE 3' without the need for via.

Figure 11:
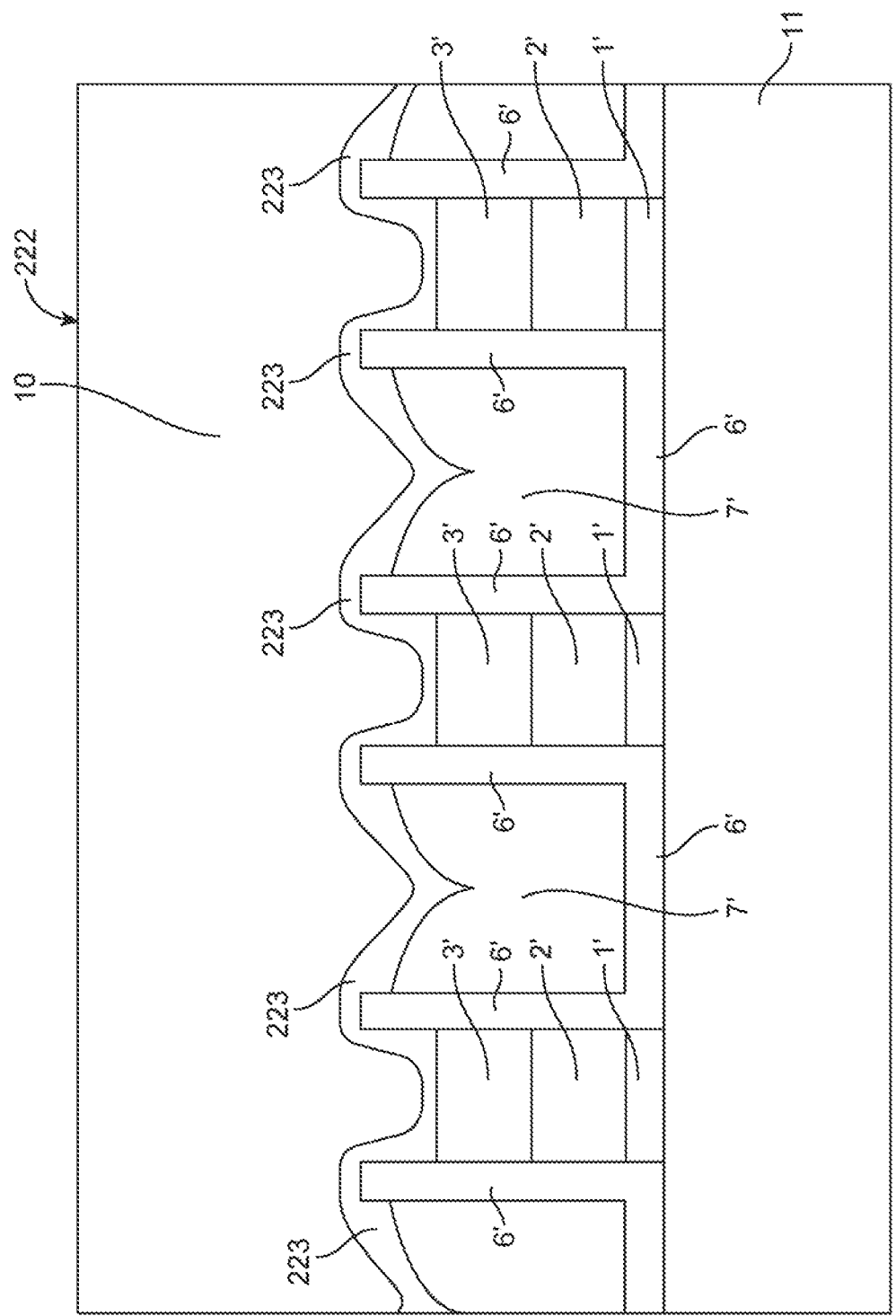

Next, at step 222 of FIG. 11, a seed layer 223 is deposited on top of the layer 7' and the layer 6' and in the extended trench 8', using conventional sputtering techniques or Chemical Vapor Deposition (CVD). Further, a metal layer is deposited on top of the seed layer 223 using conventional electroplating techniques. In some embodiments, the metal layer is made of copper or tungsten. The seed layer 223 and the metal layer that are deposited in areas other than in the trench 9' and extended trench 8' are removed by CMP. At this point, building an interconnect of the MTJ 2' to upper metal line (or "bit line") in accordance with one method of the present invention is complete and the metal layer 10 (also referred to as the "upper metal line" or "bit line") is directly connected to the MTJ 2' without requiring a via. In some embodiments, the metal layer 10 is made of copper or tungsten. Thus, a via-less process is employed to make a magnetic memory cell and avoid shorting or other reliability issues.

Next, an alternative embodiment and method is continued from after the step of FIG. 5 hereinabove to accomplish the same thing, i.e. magnetic memory cell using via-less techniques.

Figure 12:
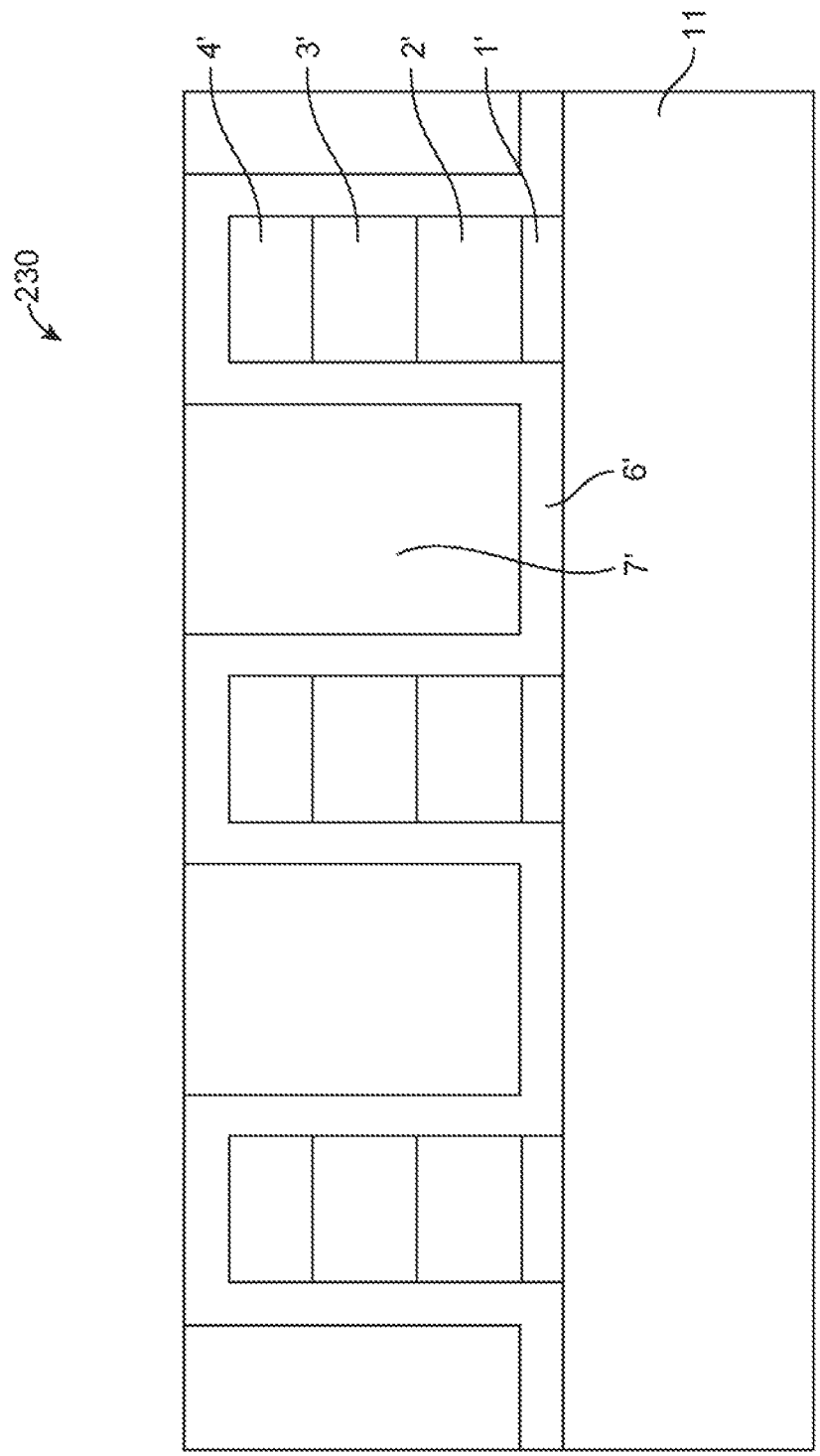
Figure 13:
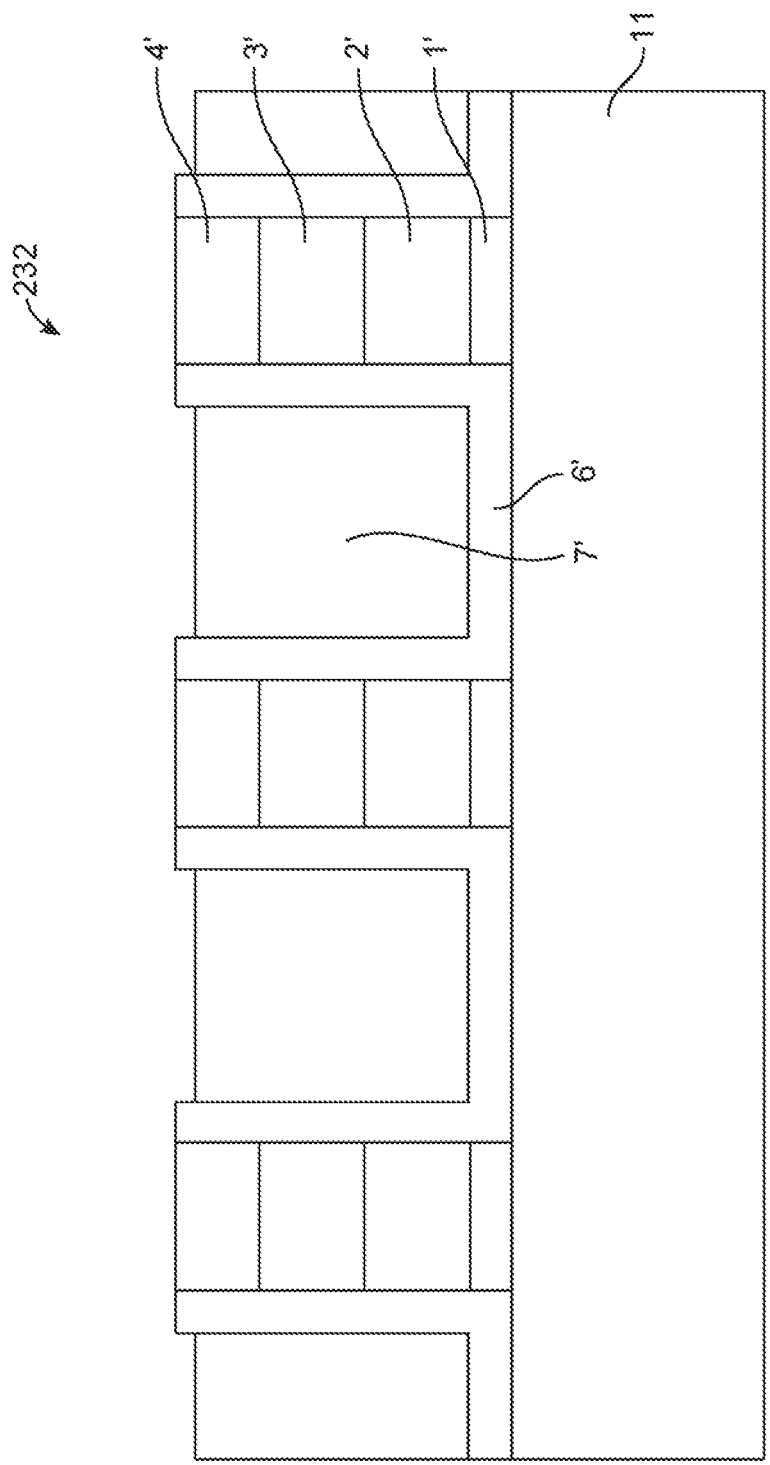

After FIG. 5, the process continues to FIG. 12 where step 230 is performed to planarize the layer 7 using CMP, down to the top of the layer 6 and between the MTJ stack pillars.

CMP is stopped during this step at the layer 6, where adopting silicon nitride for layer 6 and silicon oxide for layer 7, in those embodiments using the foregoing materials, such adoption causes the layer 6 to effectively stop the CMP. Next, at step 232, in FIG. 13, the layer 6, in areas that are on top of the MTJ pillar stack is etched to remove the same and leave the rest of this layer, layer 6', to protect the sidewall of MTJ 2', using an etching chemistry of higher nitride etch rate than an oxide etch rate, which leaves the layer 7' substantially in tact.

Figure 14:
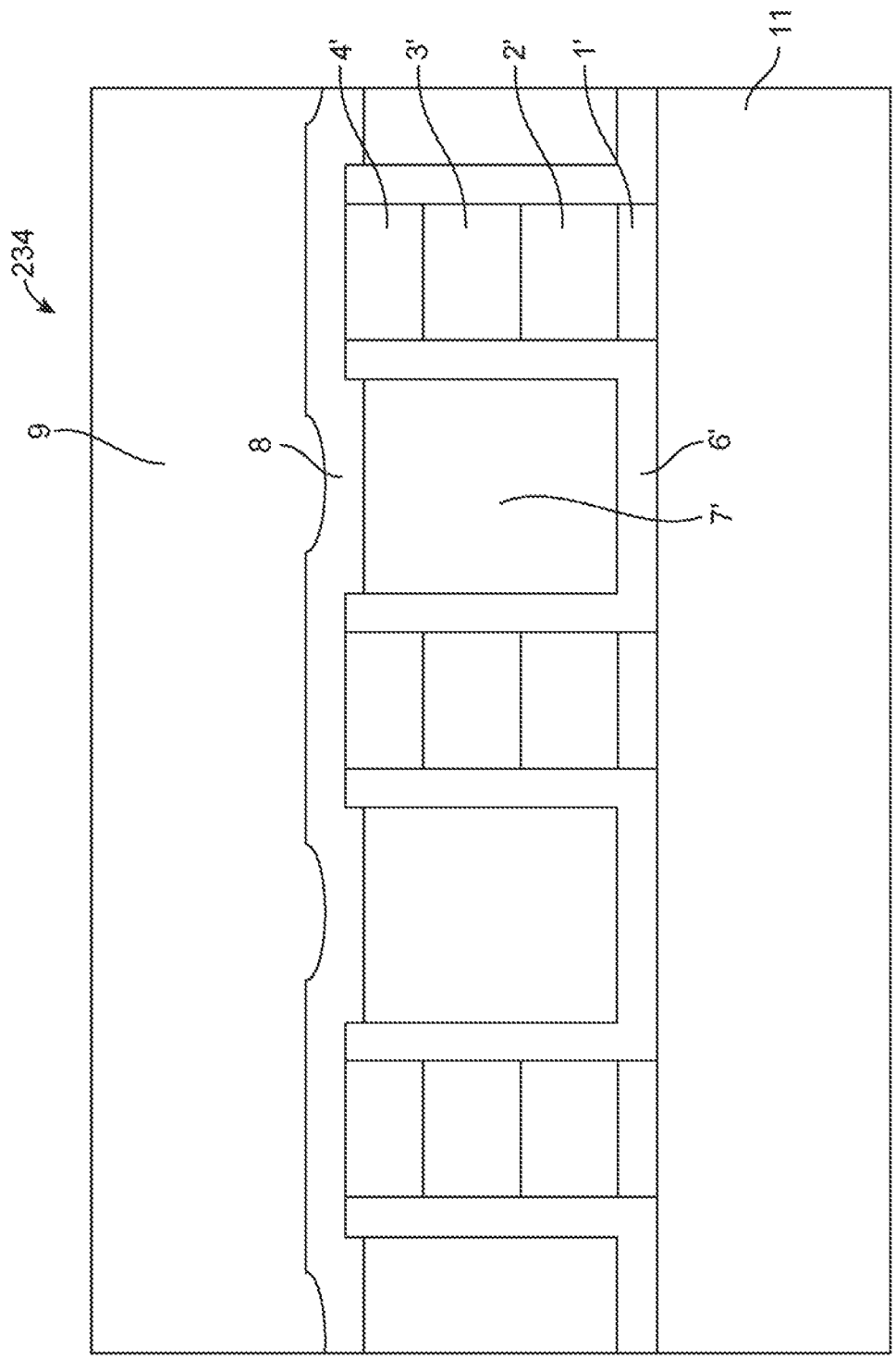

Next, at step 234, in FIG. 14, the layer 8 (also used in the alternative method herein) is deposited on top of the layer 7' and the top of the MTJ stack pillar. In some embodiments, the layer 8 is made of silicon nitride. The layer 8 is made from a different material than that of layer 7. Next, the dielectric layer 9 is deposited on top of the layer 8 and planarized using CMP. In some embodiments, the layer 9 is made of silicon oxide.

Figure 15:
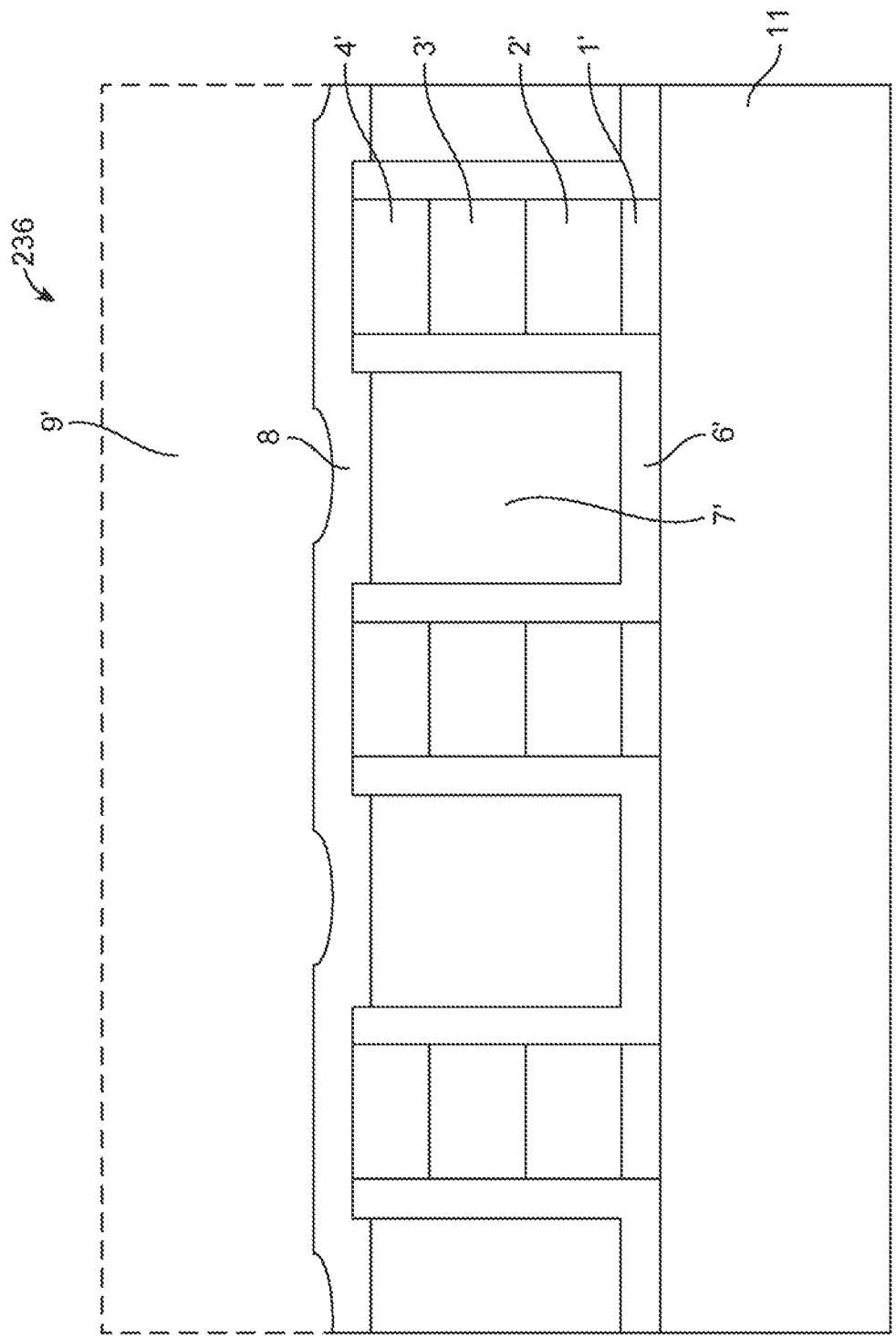
Figure 16:
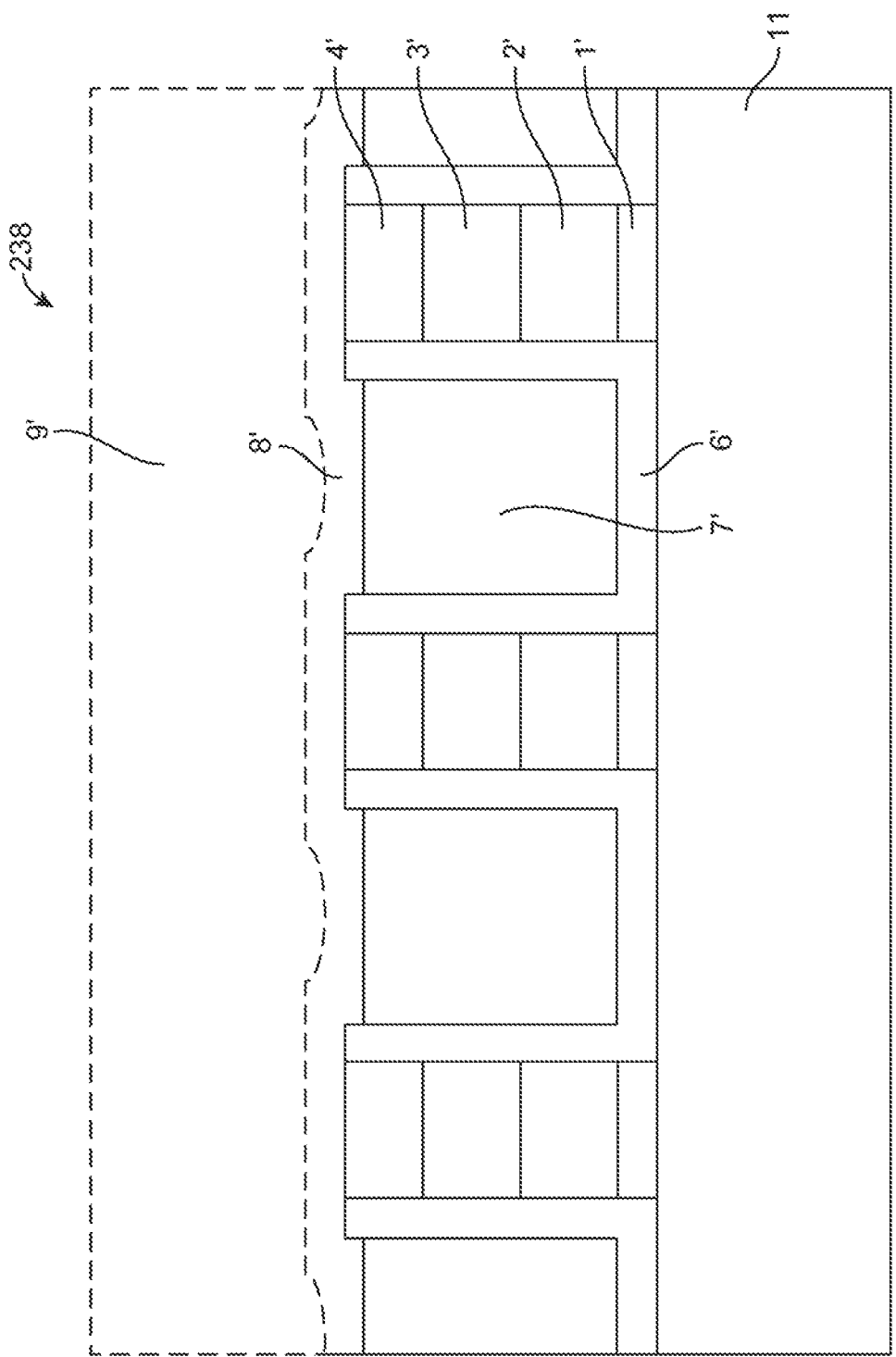

Next, at step 236 of FIG. 15, a trench 9' is formed by using a conventional lithography and vertical dry etching to remove the layer 9. This etching is stopped at the top of the layer 8 because the etching selectivity of the layer 9 relative to that of the layer 8 is manipulated to be greater than one. Next, at step 238 of FIG. 16, the layer 8 is removed to form the extended trench 8' by changing the etching chemistry and reversing the selectivity of the etching so that the etching rate of the layer 7' is slower than that of the layer 8. Additionally, the hard mask 4" is removed using etching of a similar chemistry.

Figure 17:
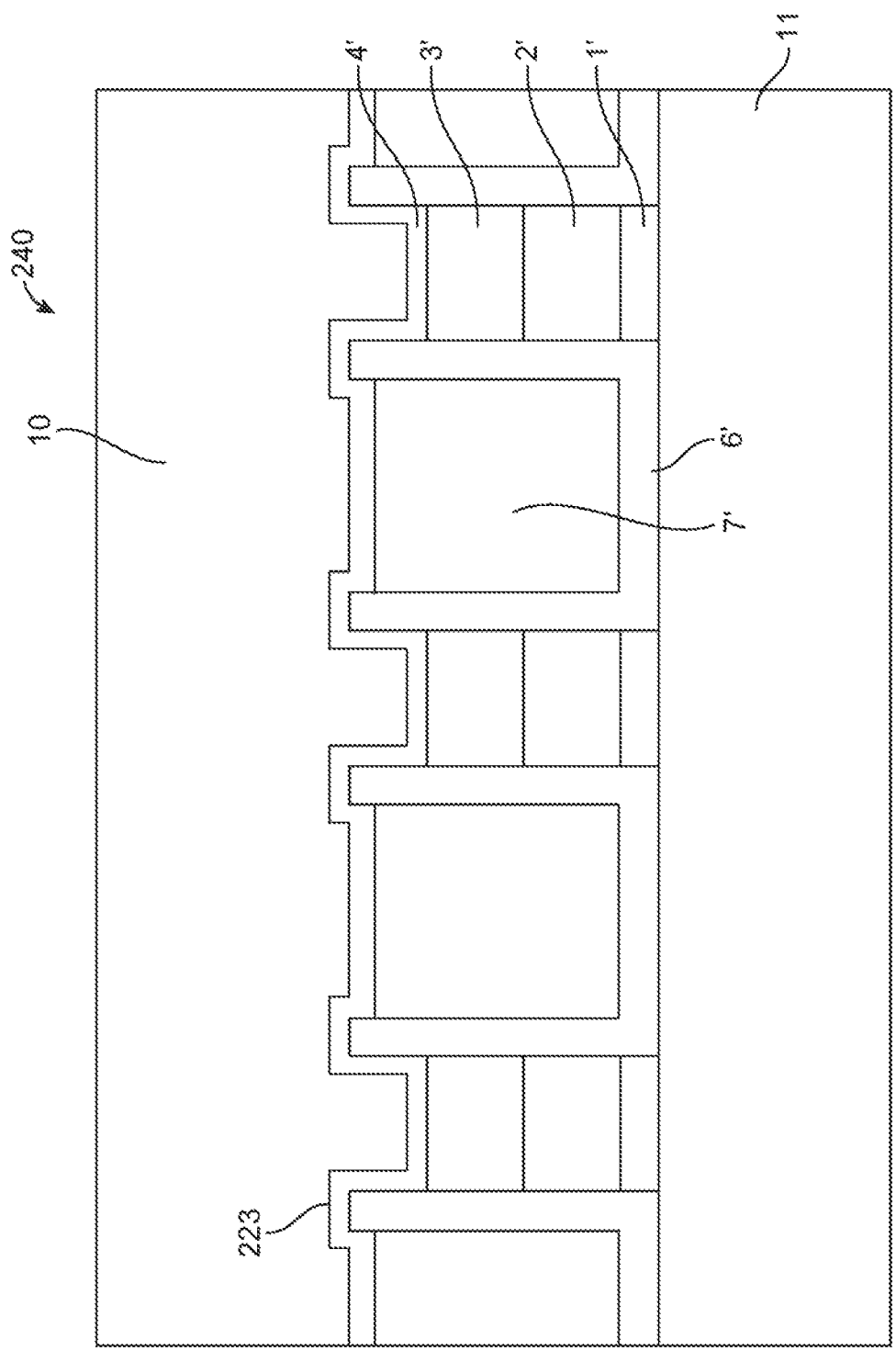

Next, at step 240, in FIG. 17, the seed layer 223 is deposited on the layer 7', the layer 6' and the MTJ stack pillar, as shown, using conventional sputtering or CVD techniques. A metal layer is deposited on the layer 223 using a conventional electroplating. In some embodiments, the metal layer is made of copper or tungsten. The seed layer 223 and the metal layer that is deposited on other than in the extended trench 8' and the trench 9' are removed by CMP to form the metal line 10. After the metal line 10 fills the trenches 8' and 9', it becomes a bit line (also referred to herein as "upper metal line"). The bit line is connected to the MTJ without the need for a via. This completes another method of making a magnetic memory cell.

While in the various embodiments and methods shown and discussed, the memory element included a MTJ, in alternative embodiments, rather than a MTJ, other types of suitable memory elements may be employed, such as but not limited to, phase shift memory, resistive random access memory (RRAM) or any other memory having a switching memory element.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of making a magnetic memory device comprising the steps of:
    forming a plurality of MTJ stack pillars with exposed sidewalls in a substrate, each of said MTJ stack pillars comprising a bottom electrode and a top electrode with an MTJ memory element interposed therebetween, and a hard mask overlying said top electrode;
    encapsulating said MTJ stack pillars by conformally depositing a first dielectric material over said substrate and said MTJ stack pillars including said exposed sidewalls thereof;
    forming an insulating matrix surrounding said MTJ stack pillars covered with said first dielectric material by depositing a second dielectric material into gaps between said MTJ stack pillars and etching away portions of said second dielectric material above said MTJ stack pillars, said insulating matrix having an upper surface recessed from portions of said first dielectric material formed on top of said MTJ stack pillars;
    forming conformal sidewall protection sleeves over said MTJ stack pillars and exposing upper surfaces of said hard masks by etching away said portions of said first dielectric material selectively to said insulating matrix;
    removing said hard masks and exposing said top electrodes by etching said hard masks selectively to said insulating matrix and said conformal sidewall protection sleeves;
    forming a dielectric interlayer on top of said MTJ stack pillars and said insulating matrix;
    etching said dielectric interlayer to form a trench with at least two of said top electrodes and said upper surface of said insulating matrix exposed on bottom of said trench; and
    forming a metal wire by filling said trench with a conductive material, said metal wire being directly coupled to at least two of said top electrodes of respective MTJ stack pillars.

2. The method of making a magnetic memory device according to claim 1, wherein said MTJ memory element comprises a magnetic fixed layer and a magnetic free layer with a barrier layer interposed therebetween.

3. The method of making a magnetic memory device according to claim 1, wherein said hard mask is made of silicon oxide, silicon nitride, aluminum oxide, or titanium nitride.

4. The method of making a magnetic memory device according to claim 1, wherein said trenches extend along a direction substantially parallel to a top surface of said substrate.

5. The method of making a magnetic memory device according to claim 1, wherein said metal wires are bit lines extending along a direction substantially parallel to a top surface of said substrate.

6. A method of making a magnetic memory cell comprising: forming a MTJ pillar stack using photolithography and vertical dry etching wherein said MTJ pillar stack includes a bottom electrode, a MTJ memory element overlying said bottom electrode further including a pinned layer, a free layer and a barrier layer in between, and a top electrode overlying said MTJ memory element, after forming a MTJ pillar stack, depositing a first and a second dielectric materials, forming a second protection layer by recessing said second dielectric material down to a level below said first dielectric material sitting on a top of said MTJ pillar, forming a first protection layer exposing said top electrode with vertical dry etching, forming an inter dielectric layer, forming a trench in said inter dielectric layer reaching to said top electrode, forming a metal line directly connected to said top electrode in said trench with Damascene process.

7. The method of making a magnetic memory device according to claim 6, wherein said trench extends along a direction substantially orthogonal to a height direction of said MTJ pillar stack.

8. The method of making a magnetic memory device according to claim 6, wherein said metal line is a bit line extending along a direction substantially orthogonal to a height direction of said MTJ pillar stack.

* * * * *